United States Patent [19]
Oudart et al.

[11] Patent Number: 5,908,304
[45] Date of Patent: Jun. 1, 1999

[54] MASS MEMORY AND METHOD FOR THE MANUFACTURE OF MASS MEMORIES

[75] Inventors: Myriam Oudart, Montlhery; François Bernard, Les Ulis; Jean-Marc Bureau, Valbonne, all of France

[73] Assignee: Thomson-CSF, Paris, France

[21] Appl. No.: 08/805,850

[22] Filed: Mar. 3, 1997

[30] Foreign Application Priority Data

Mar. 8, 1996 [FR] France ................................ 96 02959

[51] Int. Cl.[6] .......................... H01L 21/44; H01L 21/48; H01L 21/50
[52] U.S. Cl. .......................... 438/109; 438/106; 438/107
[58] Field of Search .................... 438/109, 107, 438/106

[56] References Cited

U.S. PATENT DOCUMENTS

| | | | |
|---|---|---|---|
| 4,983,533 | 1/1991 | Go ............................................. | 438/109 |
| 5,104,820 | 4/1992 | Go, et al. ................................. | 438/109 |
| 5,235,672 | 8/1993 | Carson ..................................... | 438/109 |
| 5,362,986 | 11/1994 | Angiulli et al. . | |
| 5,397,747 | 3/1995 | Angiulli et al. ........................ | 438/109 |

FOREIGN PATENT DOCUMENTS

| | | |
|---|---|---|
| 0 073 486 | 3/1983 | European Pat. Off. . |
| 0 238 066 | 9/1987 | European Pat. Off. . |
| 0 535 479 A1 | 4/1993 | European Pat. Off. . |
| 0 644 548 | 3/1995 | European Pat. Off. . |
| 2 688 629 | 9/1993 | France . |
| WO 94/26083 | 11/1994 | WIPO . |

OTHER PUBLICATIONS

Chang–Lee Chen, et al., "Bond Wireless Multichip Packaging Technology for High–Speed Circuits", IEEE Transactions On Components, Hybrids, and Manufacturing Technology, vol. 15, No. 4, (1992), pp. 451–456.

*Primary Examiner*—Kevin M. Picardat
*Assistant Examiner*—Deven Collins
*Attorney, Agent, or Firm*—Oblon, Spivak, McClelland, Maier & Neustadt, P.C.

[57] ABSTRACT

The disclosure relates to a mass memory with very large-scale integration as well as to a method for the manufacture of such a memory.

6 Claims, 6 Drawing Sheets

MASS MEMORY AND METHOD FOR THE MANUFACTURE OF MASS MEMORIES

BACKGROUND OF THE INVENTION

1. Field of the Invention

The field of the invention is that of high-density mass memories or mass storage units that are essential for high-performance computation systems and for data storage systems.

2. Description of the Prior Art

At present, increasingly miniaturized packages containing one or more chips have been developed for these applications and enable the amount of space occupied on an interconnection card to be reduced. The fact of bringing together the memories and the control circuits has the further effect of improving the electrical performance characteristics and, in particular, of reducing the propagation time of the signals.

Thus, rather than organizing the chips side by side on a plane interconnection substrate, it has already been proposed to stack a number of bare chips, one on top of the other, in order to further increase the integration density and obtain optimum interconnection lengths. The memory circuits are well suited to this type of assembly for they dissipate little power and have a relatively small number of inputs/outputs. Most of them can be connected to signal buses common to many chips. Assemblies of this kind are presently being made by Texas Instruments, Irvine Sensors or again THOMSON-CSF (see C-VAL, 9th European ISHM Conference, Nice, 1993, Conference Report, page 304 and R. T. CROWLEY and E. J. VARDAMAN in MCM'94 Proceedings). A factor of the order of 100 in terms of volume density may thus be obtained as compared with conventional packages.

The technologies used initially require a method to reconfigure the inputs/outputs of the chips on one or more sides in order to obtain access thereto once the stack is made. This may be done on the silicon wafer or else on the cut-out chip. FIG. 1 shows one of these methods where a thin printed circuit 1 is mounted by bonding or wiring on the surface of the chip 2. This printed circuit has the role of mounting the inputs/outputs located in the plane of the chip (for example on its two small sides) by means of tracks located above this plane and reaching beyond the edge of the chip (for example on one of its large sides). The chip can be bonded to the printed circuit by means of an adhesive element 3. The wiring is done with wires 4 inserted into windows 5 made in the printed circuit 1.

After reconfiguration in this manner, a number of chips (for example 8) are stacked and held together by means of adhesive films or films of encapsulating liquid resin. FIG. 2 shows a stack of reconfigured chips of this kind. In the case of the example referred to, the thin printed circuits also have centering holes 6 located beyond the border of the chip. These centering holes 6 can be used to position the chips with respect to one another during the stacking. The chips and the printed circuits are superimposed by means of positioning rods 7 and shims used to set the pitch of a stack. This assembly is then coated with a thermo-hardening liquid resin that will fill all the interstices and hold the unit mechanically.

The three-dimensional block 8 thus made is prepared on the face providing access to the inputs/outputs of the chip, to enable these chips to be connected. For this purpose, the resin may be machined on the side containing the tracks that go beyond the edge of the chips so as to obtain a plane resin face comprising metal zones corresponding to the sections of said tracks as illustrated in FIG. 3.

These inputs/outputs are then interconnected either by metallization and etching to form conductive tracks or by being mounted, by soldering, on an interconnection substrate. FIG. 4 illustrates the mounting of a memory block 8, comprising several chips, on an interconnection substrate 9. Through this mounting operation, it is generally possible to increase the pitch between contiguous inputs/outputs to give inputs/outputs that can easily be attached to a standard printed circuit 11 comprising an interconnection 12 used to connect the memory block 8 to a control circuit 10 also mounted on the printed circuit 11.

The connection of a block 8 to the substrate 9 may typically be made by wiring, bonding with conductive resin, lugs or metal beads.

The unit formed by the block 8 and the control circuit 10 mounted on the printed circuit 11 gives a functional mass memory.

SUMMARY OF THE INVENTION

To further increase the density of such functional memories, the invention proposes a novel architecture of a functional memory in which a macroblock formed by a monolithic arrangement of blocks similar to the above-described blocks 8 constitutes an interconnection substrate on which there is made an interconnection network enabling the printed circuits to be directly mounted on said interconnection network.

More specifically, an object of the invention is a functional mass memory comprising blocks of stacked chips connected to control circuits by means of an interconnection network, wherein said mass memory comprises a macroblock constituted by a matrix arrangement of blocks of stacked chips; said monolithic arrangement constituting a substrate on which the network of interconnections and the control circuits are superimposed.

An object of the invention also is a method for the manufacture of a functional mass memory according to the invention.

More specifically, it is a method for the manufacture of a functional mass memory comprising blocks of stacked chips, one face of which comprises sections of conductive tracks connected to the inputs/outputs of the chips, an interconnection network and control circuits, this method comprising the following steps:

- the making of a macroblock formed by a matrix arrangement of blocks of stacked chips; said macroblock having a face on which the track sections appear;
- the making of an interconnection network on the face of the macroblock;
- the connection of control circuits to the interconnection network.

BRIEF DESCRIPTION OF THE DRAWINGS

The invention will be understood more clearly and other advantages shall appear from the following description, given as a non-restrictive example with reference to the appended figures, of which.

MORE DETAILED DESCRIPTION

Figure 1:
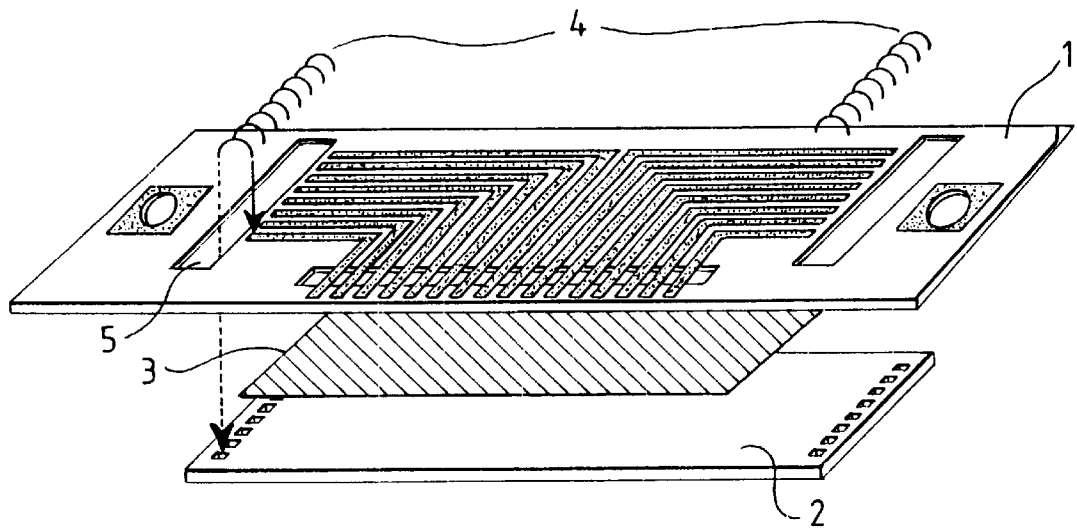
FIG. 1 illustrates an electrical connection between a chip and a printed circuit, made in order to mount the inputs/outputs of the chip according to the prior art.
Figure 2:
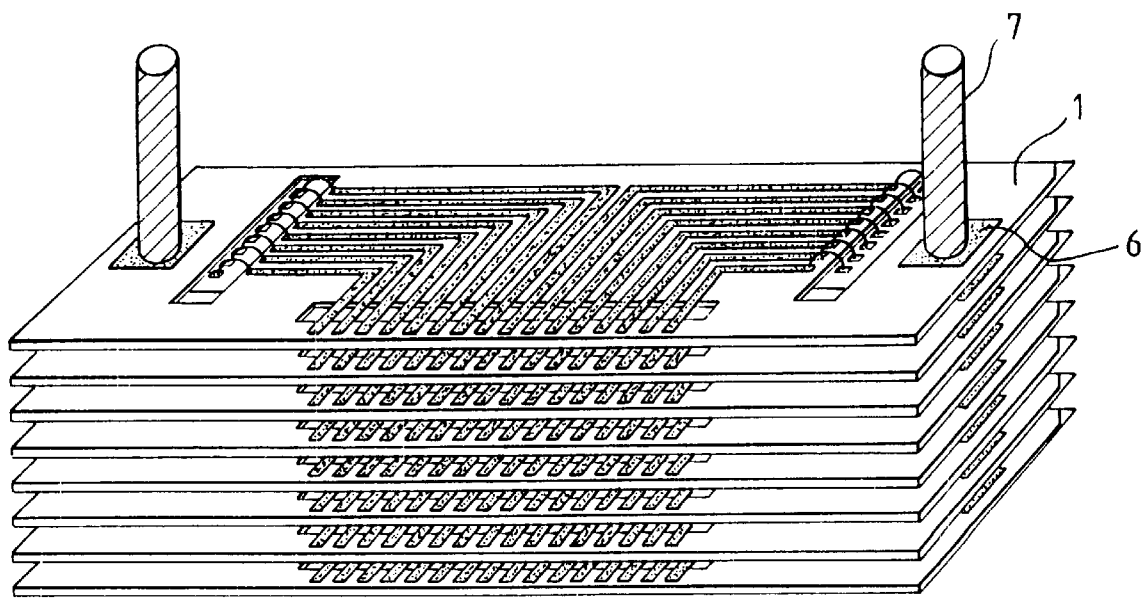
FIG. 2 illustrates a stack of chips attached to a printed circuit according to the prior art.
Figure 3:
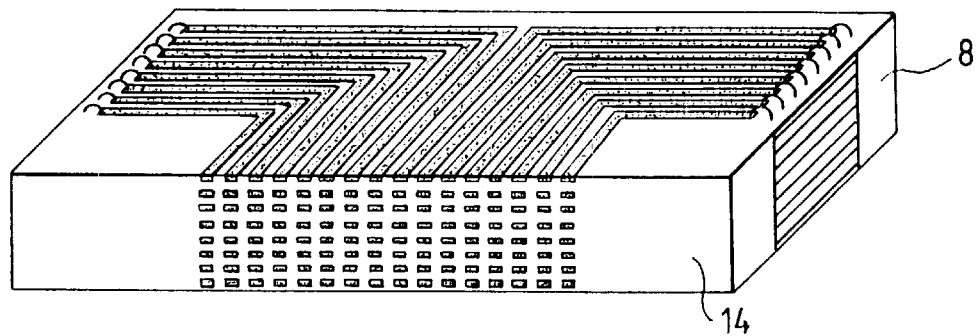
FIG. 3 illustrates a block of stacked chips having a face on which there can be seen sections of conductive tracks connected to the inputs/outputs of the chips, according to the prior art.
Figure 4:
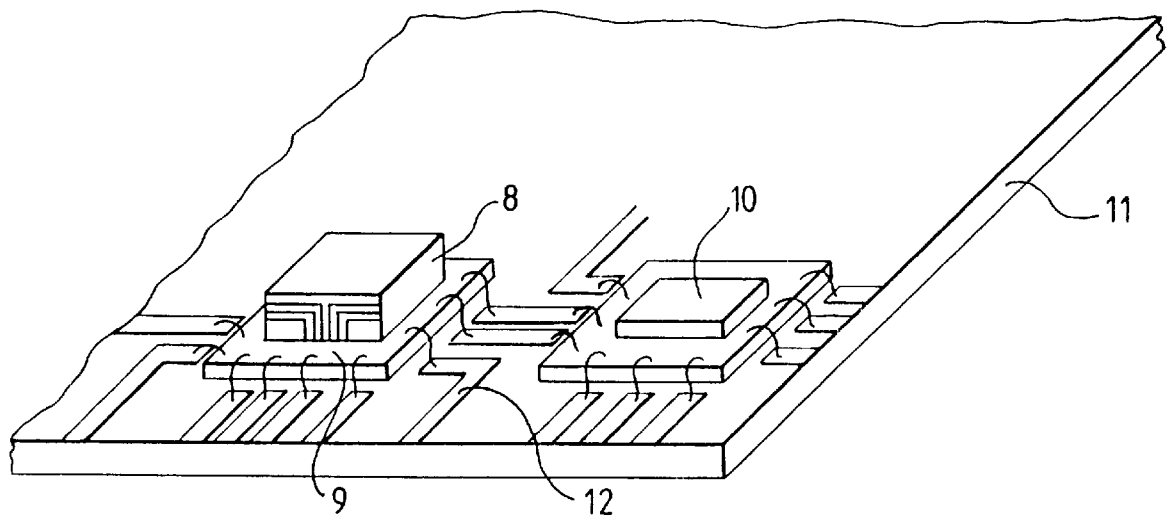
FIG. 4 illustrates a part of a functional mass memory according to the prior art, in which the blocks of stacked chips are connected to control circuits by means of connection substrates and a standard interconnection network.
Figure 5:
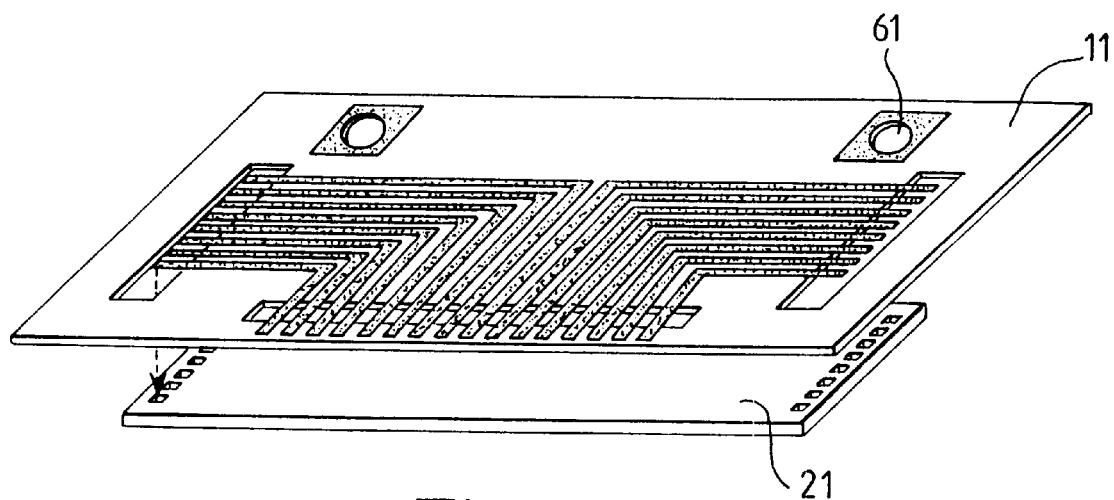
FIG. 5 illustrates a first exemplary electrical connection between a chip and a printed circuit that can be used in the invention.

The functional mass memory according to the invention is made out of elementary blocks comprising reconfigured memories that exist in the prior art. A description has been given here above, with reference to FIG. 1, of a reconfiguration of the inputs/outputs of the memory chips by using wiring but other techniques could be used. It is possible in particular to reconfigure the memory chips by extending the tracks of the printed circuit 11 up to the interconnection pads of the chip 21, as shown in FIG. 5. Each printed circuit 21, according to the present invention, may have positioning holes 61 and is made out of an ultra-thin flexible circuit (for example a 50 μm thick polyimide film having 35 μm thick copper tracks). It is possible then to directly connect these tracks to the chip by thermocompression or by laser.

Figure 6:
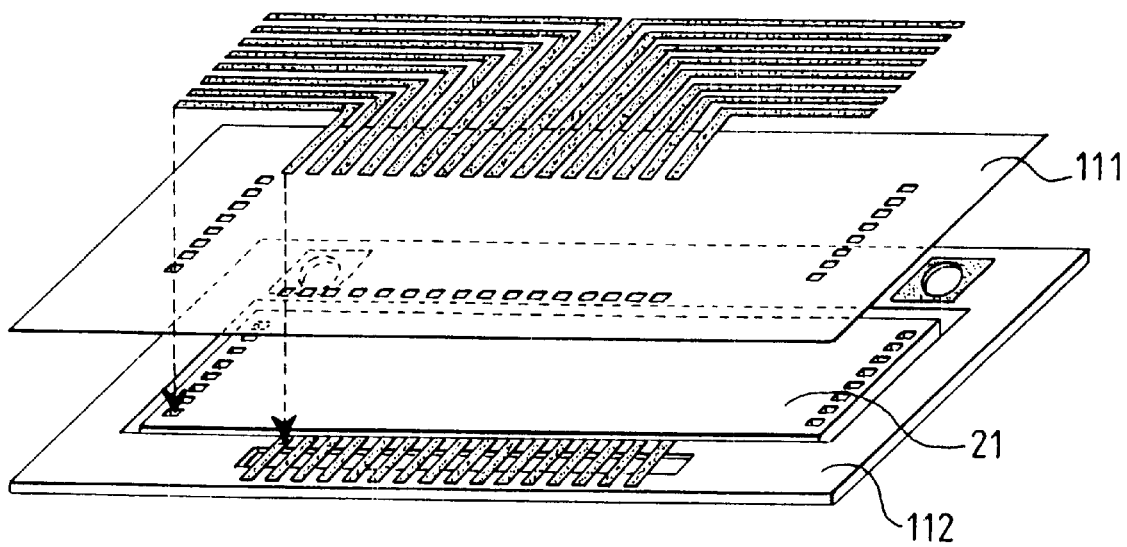
FIG. 6 illustrates a second exemplary electrical connection between a chip and a printed circuit that can be used in the invention.

The reconfiguration can also be done by using a hollowed-out flexible circuit 112 as shown in FIG. 6 in order to insert the chip 21 in such a way that the surface of the flexible circuit and that of the chip are at the same level. It is then possible to make the interconnection by the deposition (for example by lamination) of a film on this surface, by piercing said film at the position of the inputs/outputs of the chip and of the flexible circuit and by connecting them by means of a metallization deposited in a thin layer.

Figure 7:
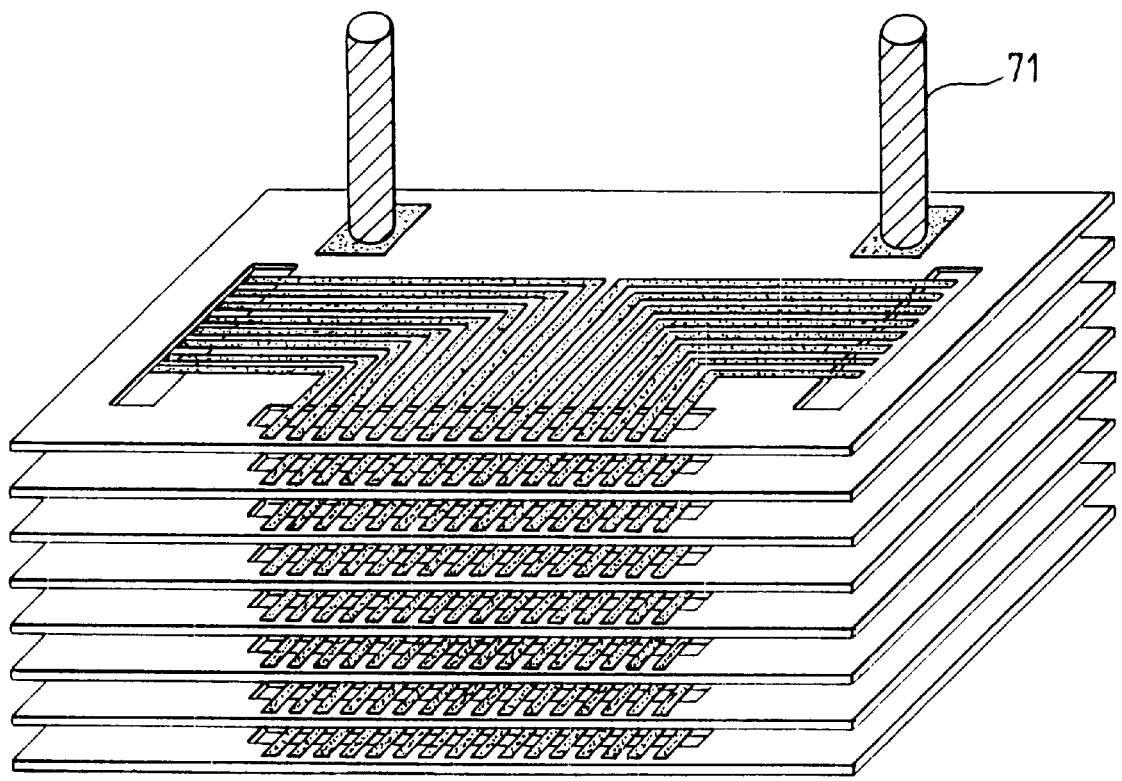
FIG. 7 illustrates a stack of chips and printed circuits used in the invention.

The blocks of reconfigured chips (for example eight chips) may then be made by the stacking of sets formed by a flexible circuit and a chip. For this purpose, an adhesive preform is interposed between each unit consisting of a chip and a flexible circuit and the next such unit. This adhesive preform fills all the interstices and provides for the strength of the entire block. FIG. 7 shows an assembly of this kind using positioning rods 71.

The block is then cut out perpendicularly to the stack so that the sections of the tracks extending over the border of the chips are flush.

Figure 8:
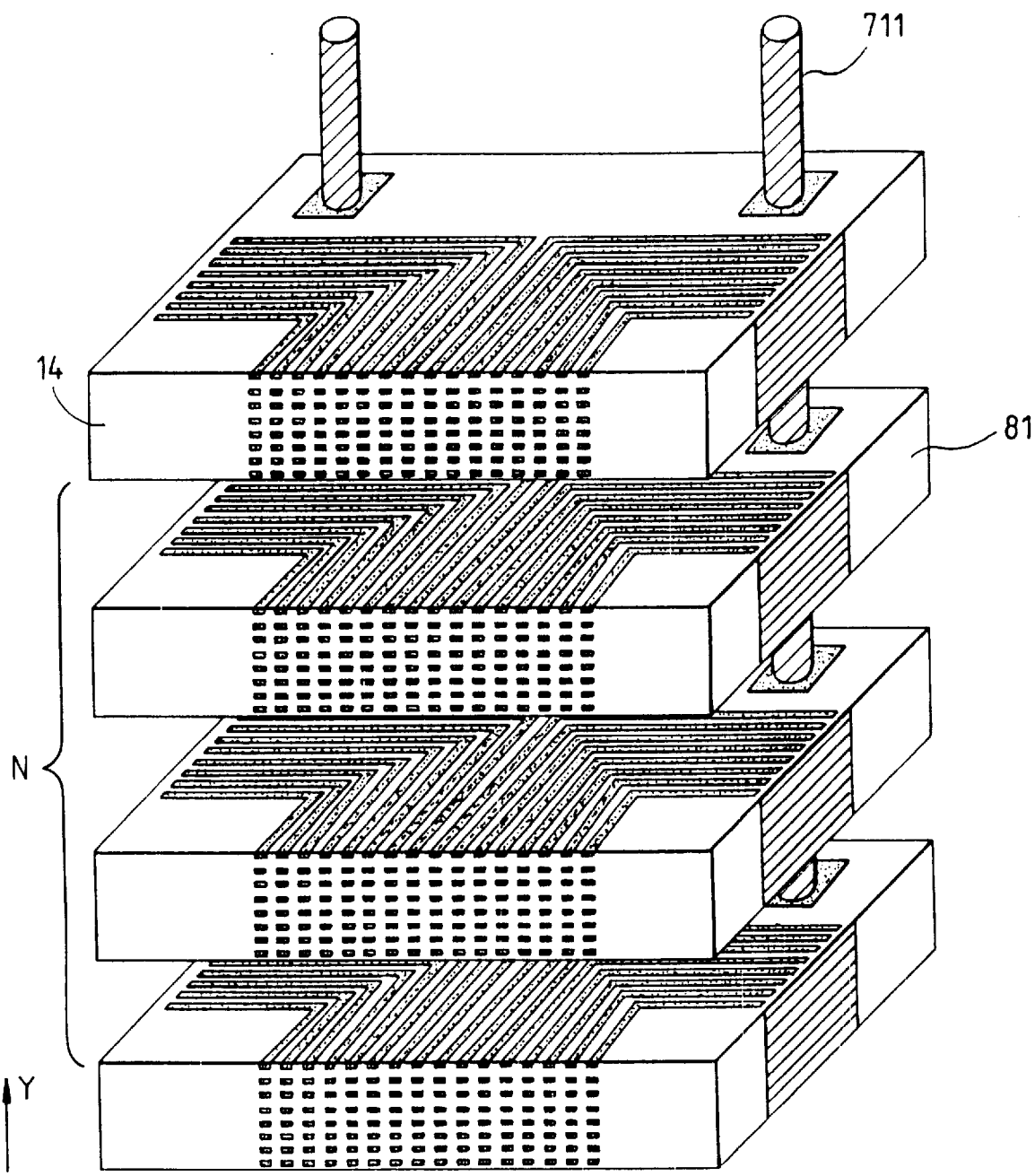
FIG. 8 illustrates a step for the stacking of blocks 81 used in an exemplary method of manufacture of a functional mass memory according to the invention.

According to an exemplary method according to the invention, N elementary blocks 81 are superimposed in a direction Y shown in FIG. 8, the face 14 with the inputs/outputs being presented always on the same side.

The presence of positioning holes 711 in each block 81 can facilitate the assembling and precise positioning of the blocks.

In a second stage, M sets of N elementary blocks are attached together in a direction X orthogonal to the direction Y.

To carry out these different assembling operations, adhesive films may be interposed between each block or set of blocks and the next block or set of blocks. Or else, the unit may be encapsulated in an encapsulating resin.

Figure 9:
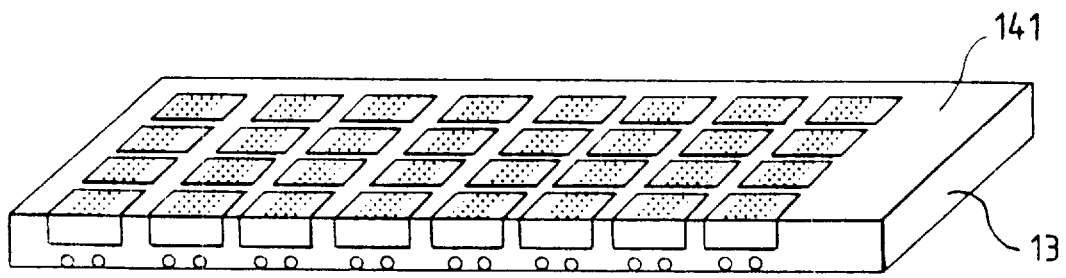
FIG. 9 illustrates a macroblock consisting of the matrix arrangement of M×N blocks of stacked chips.

The matrix arrangement of M×N elementary blocks 81 constitutes a macroblock that is machined and has its surface polished, if necessary, to obtain a plane surface 141, where all the sections of the tracks corresponding to the inputs/outputs of each memory are flush with this surface. FIG. 9 illustrates a macroblock 13 of this kind with its face 141 comprising the set of the tracks sections representing the inputs/outputs of each chip.

During the assembling of M sets of N elementary blocks, it is possible to insert additional functional elements such as connectors or heat sinks in the macroblock 13.

One of the useful features of the invention lies in the use of this macroblock 13 as an interconnection substrate. Indeed, according to the method of the invention, it is advantageously possible to make an interconnection network on the face 141 of the macroblock 13.

For this purpose, the inputs/outputs of the chips are electrically connected in batches by a metal deposition that comes into contact with each track section, and conductive tracks are etched in this metal layer according to the desired architecture and electrical drawing.

Figure 10:
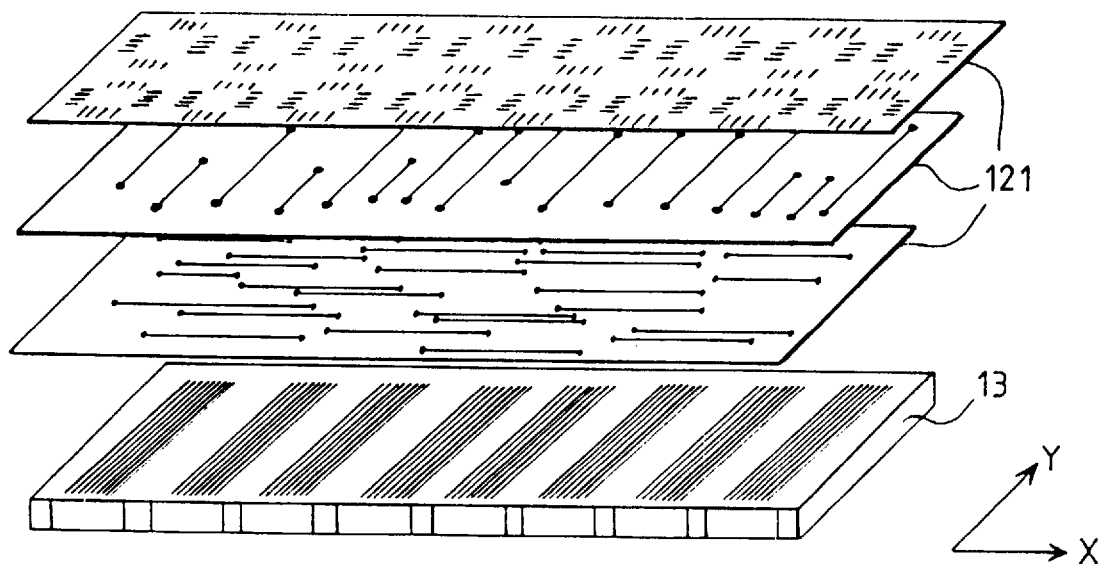
FIG. 10 illustrates a step for the making of an interconnection network made on the surface of a macroblock of the invention.

This interconnection may be a multilayer interconnection made by the interposing, between each metal layer and the next one, of a dielectric level drilled with a via hole as shown in FIG. 10. This FIG. 10 shows a dielectric level superimposed on the macroblock 13, on which electrical contacts have been made beforehand between blocks 81 aligned in the direction Y. The interconnection network 121 can be made by means of the standard methods used to make printed circuits with large-scale integration (such as the deposition of materials by lamination, laser drilling, chemical or electrolytic metallization), methods used in microelectronics (the deposition of liquid dielectrics, drilling by plasma or ion etching, metallization by vapor deposition or vacuum spray deposition) or any combination of methods known in the prior art.

Figure 11:
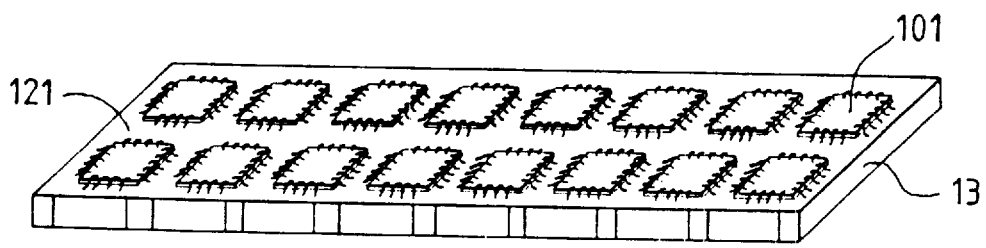
FIG. 11 illustrates a functional mass memory according to the invention, comprising blocks of stacked memory chips, an interconnection network and control circuits.

To make the functional mass memory, the different control chips 101 are mounted on the interconnection network 121, on mounting zones made for this purpose on the last layer of the interconnection network as shown in FIG. 11. As it happens, the mounting zones are made on the lower layer of the interconnection network as shown in FIG. 10.

When electrical connectors have been integrated into the macroblock 13 during manufacture, it is possible to obtain the direct interconnection of several mass memories with one another, giving a memory with very large-scale integration.

What is claimed is:

1. A method of manufacturing a mass memory made of blocks of stacked chips, an interconnection network and control circuits, one face of said blocks having sections of conductive tracks connected to the input/outputs of said chips, comprising the steps of:

making a unitary macroblock formed by an N×M matrix arrangement formed by M stacks, each stack having N blocks of stacked chips;

machining the macroblock so as to reveal said face on which conductive track sections appear;

making said interconnection network on the face of the macroblock; and connecting said control circuits to the interconnection network.

2. A method of manufacturing according to claim 1, further comprising the steps of:

machining positioning holes in the blocks in a direction Y perpendicular to the plane of the chips;

making stacks of blocks in the direction Y by introducing positioning rods into the positioning holes; and assembling stacks in a direction X perpendicular to the direction Y.

3. A method of manufacturing according to claim 1, further comprising the steps of:

encapsulating the matrix arrangement in an encapsulation resin;

polishing the machined face of the encapsulated macroblock.

4. A method of manufacturing according to claim 1, wherein the step of making an interconnection network includes alternating deposits of metal layers and dielectric layers drilled with via holes.

5. A method of manufacturing according to claim 2, wherein the step of making an interconnection network includes alternating deposits of metal layers and dielectric layers drilled with via holes.

6. A method of manufacturing according to claim 3, wherein the step of making an interconnection network includes alternating deposits of metal layers and dielectric layers drilled with via holes.

* * * * *